(12) United States Patent
Doornbos et al.

(10) Patent No.: US 7,791,128 B2
(45) Date of Patent: Sep. 7, 2010

(54) DOUBLE GATE NON-VOLATILE MEMORY DEVICE AND METHOD OF MANUFACTURING

(75) Inventors: Gerben Doornbos, Heverlee (BE); Pierre Goarin, Etterbeek (BE)

(73) Assignee: NXP B.V., Eindhoven (NL)

( * ) Notice: Subject to any disclaimer, the term of this patent is extended or adjusted under 35 U.S.C. 154(b) by 290 days.

(21) Appl. No.: 12/067,986

(22) PCT Filed: Sep. 26, 2006

(86) PCT No.: PCT/IB2006/053491

§ 371 (c)(1),
(2), (4) Date: Mar. 25, 2008

(87) PCT Pub. No.: WO2007/036876

PCT Pub. Date: Apr. 5, 2007

(65) Prior Publication Data

US 2008/0230824 A1    Sep. 25, 2008

(30) Foreign Application Priority Data

Sep. 28, 2005    (EP) .................................. 05108972

(51) Int. Cl.
*H01L 29/788* (2006.01)
(52) U.S. Cl. .............................. 257/316; 257/E29.129; 438/201
(58) Field of Classification Search ................. 257/315, 257/316, E29.129; 438/201
See application file for complete search history.

(56) References Cited

U.S. PATENT DOCUMENTS

| 5,751,037 | A | 5/1998 | Aozasa et al. |
| 6,768,158 | B2 | 7/2004 | Lee et al. |
| 6,800,885 | B1 | 10/2004 | An et al. |
| 6,800,905 | B2* | 10/2004 | Fried et al. .................. 257/351 |
| 2003/0201458 | A1* | 10/2003 | Clark et al. ................. 257/192 |
| 2004/0227180 | A1 | 11/2004 | Huang et al. |
| 2004/0235300 | A1* | 11/2004 | Mathew et al. .............. 438/689 |
| 2006/0267111 | A1* | 11/2006 | Anderson et al. ........... 257/401 |
| 2007/0076477 | A1* | 4/2007 | Hwang et al. .......... 365/185.08 |
| 2007/0099350 | A1* | 5/2007 | Zhu ........................... 438/142 |
| 2007/0148939 | A1* | 6/2007 | Chu et al. ................... 438/590 |
| 2007/0241367 | A1* | 10/2007 | Ouyang et al. .............. 257/190 |
| 2009/0108351 | A1* | 4/2009 | Yang et al. .................. 257/347 |
| 2009/0170271 | A1* | 7/2009 | Yoon et al. .................. 438/301 |

FOREIGN PATENT DOCUMENTS

WO    03096425 A1    11/2003

* cited by examiner

*Primary Examiner*—Allan R Wilson

(57) ABSTRACT

The present invention relates to a non-volatile memory device on a substrate layer comprising semiconductor source and drain regions, a semiconductor channel region, a charge storage stack and a control gate; the channel region being fin-shaped having two sidewall portions and a top portion, and extending between the source region and the drain region; the charge storage stack being positioned between the source and drain regions and extending over the fin-shaped channel, substantially perpendicularly to the length direction of the fin-shaped channel; the control gate being in contact with the charge storage stack, wherein—an access gate is provided adjacent to one sidewall portion and separated therefrom by an intermediate gate oxide layer, and—the charge storage stack contacts the fin-shaped channel on the other sidewall portion and is separated from the channel by the intermediate gate oxide layer.

16 Claims, 3 Drawing Sheets

DOUBLE GATE NON-VOLATILE MEMORY DEVICE AND METHOD OF MANUFACTURING

FIELD OF THE INVENTION

The present invention relates to a double gate non-volatile memory device.

Also, the present invention relates to a method of manufacturing such a memory device.

BACKGROUND OF THE INVENTION

For reasons of scaling, the use of planar MOSFET structures in device generations with a 65 nm design rule and smaller is becoming more and more complicated due to so-called short channel effects.

An improvement of device characteristics can be obtained by application of a finFET structure. In a finFET, on top of an insulating layer a (relatively narrow) silicon line (a fin) is created between a source region and a drain region to serve as a channel. Next, a line-shaped control gate is created which crosses the fin. The control gate, which is separated from the fin by a thin gate oxide film surrounds (in cross-section) both the sidewalls and the top of the fin, which allows for a relatively large field effect by the gate on the fin channel.

For Flash memory, an application of a finFET structure as described above has been disclosed in U.S. Pat. No. 6,768,158. Between the control gate and the fin material a charge trapping layer stack is positioned. Here, the charge trapping stack layers follow the profile of the fin along both the sidewalls and the top of the fin. The control gate layer follows the profile of the charge trapping stack layers. The charge trapping layer stack comprises either a poly-silicon floating gate or a layer stack of silicon dioxide-silicon nitride-silicon dioxide for trapping charge. Under the control of the control gate, carriers can be transported from the channel to the charge trapping layer to write (or program) data in the Flash memory cell. The mechanism for such a transport of charge depends on the type of charge trapping layer stack: for a poly-silicon floating gate transport takes place by hot carrier injection or by direct tunneling, for a silicon nitride layer by direct tunneling of carriers.

Also, a mechanism for a reversed action to erase the data (charge) from the charge trapping layer is available. Further, a sensing or reading action is available which is used for detecting whether charge is stored in the charge trapping layer. The structure of the non-volatile memory element as disclosed has the disadvantage that data retention, i.e., retention of charge, in the charge trapping layer stack is adversely affected by the above-mentioned method of sensing the charge (reading the stored data). In the finFET of U.S. Pat. No. 6,768,158, sensing the charge is done by the same control gate that is used for storing charge. By comparison with a threshold voltage it can be determined what data is stored (e.g., a bit value 0 or 1). Disadvantageously, this sensing action involves biasing of the control gate, which stimulates stored charge to leak away from the charge trapping layer.

SUMMARY OF THE INVENTION

It is an object of the present invention to provide a double gate non-volatile memory device in which data retention due to sensing is strongly reduced.

The present invention relates to a non-volatile memory device on a substrate layer comprising semiconductor source and drain regions, a semiconductor channel region, a charge storage stack and a control gate;

the channel region being fin-shaped having two sidewall portions and a top portion, and extending between the source region and the drain region;

the charge storage stack being positioned between the source and drain regions and extending over the fin-shaped channel, substantially perpendicularly to the length direction of the fin-shaped channel;

the control gate being in contact with the charge storage stack, wherein an access gate is provided adjacent to one sidewall portion and is separated therefrom by an intermediate gate oxide layer, and the charge storage stack contacts the fin-shaped channel on the other sidewall portion and is separated from the channel by the intermediate gate oxide layer.

Advantageously, by providing an access gate on one side of the fin and a control gate on the other side, the sensing functionality can be separated from the programming functionality. The exposure of the charge trapping layer to the biasing voltage during sensing is thus removed, which enhances the data retention significantly.

The present invention relates to a method of manufacturing a non-volatile memory device on a substrate layer; the method comprising:

forming semiconductor source and drain regions;

forming a semiconductor channel region, the channel region being fin-shaped having two sidewall portions and a top portion, and extending between the source region and the drain region;

forming a gate oxide layer covering the sidewalls and the top portion of the fin;

forming a charge storage stack, the charge storage stack being positioned between the source and drain regions and extending over the fin-shaped channel, substantially perpendicularly to the length direction of the fin-shaped channel, and forming a control gate, the control gate being in contact with the charge storage stack, wherein the method further comprises forming an access gate adjacent to one sidewall portion and separated from the channel by an intermediate gate oxide layer, and forming the charge storage stack adjacent to the other sidewall portion for contacting the fin-shaped channel on the other sidewall portion, said charge storage stack being separated from the channel by the intermediate gate oxide layer.

BRIEF DESCRIPTION OF THE DRAWINGS

For the purpose of teaching of the invention, preferred embodiments of the devices and method of the invention are described below. It will be appreciated by the person skilled in the art that other alternative and equivalent embodiments of the invention can be conceived and reduced to practice without departing from the true spirit of the invention, the scope of the invention being limited only by the appended claims.

DETAILED DESCRIPTION OF EMBODIMENTS

Figure 1:
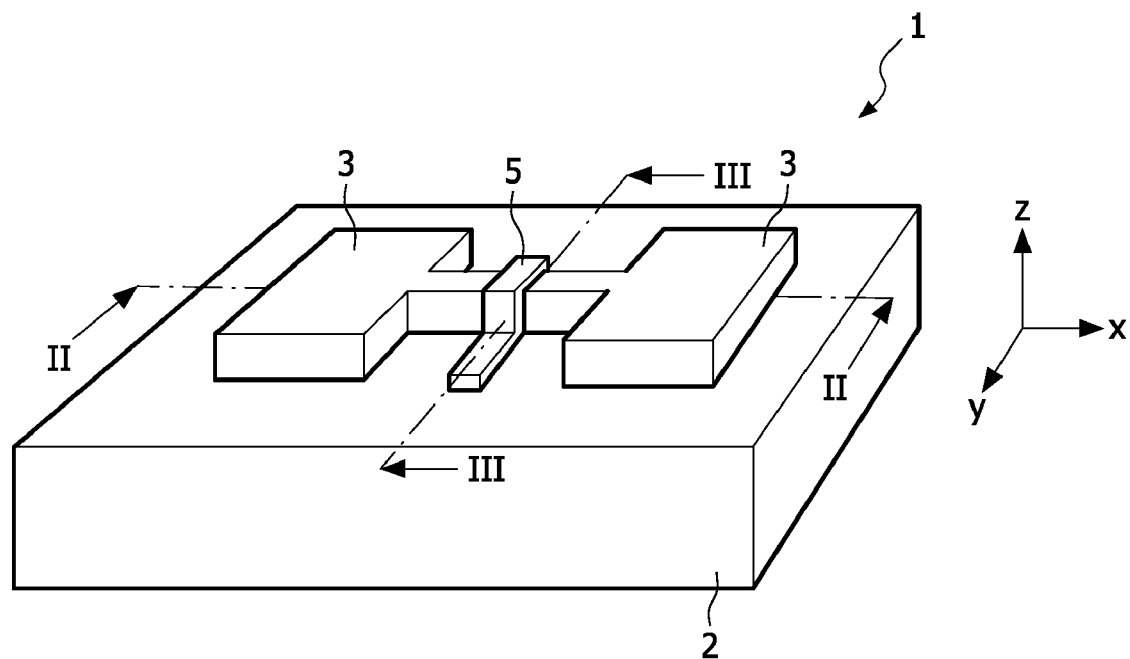
FIG. 1 shows a layout of a finFET structure in a perspective view.

FIG. 1 shows a layout of a finFET structure in a perspective view.

A finFET structure 1 is located on an insulating layer 2, for example a silicon dioxide layer or a BOX (Buried Oxide) layer of a SOI wafer (SOI: silicon on insulator).

The finFET structure 1 comprises source and drain regions 3 and a (relatively narrow) line or fin 4 which is located between the source and drain regions and interconnects them. Source, drain and fin regions 3, 4 consist of silicon semiconductor material. The fin region 4 has a substantially rectangular cross-section with two sidewall portions 4a, 4b and a top portion 4c. Source, drain and fin regions 3, 4 are defined and created by lithographic processing technology.

Typically, the height of the fin 4 is between 30 and 100 nm, the width of the fin 4 is typically equal to or less than its height. The length of the fin 4 is typically 70-100 nm.

A gate 5 is positioned on the insulating layer 2 between the source and drain regions 3 and extends over the fin 4 along the Y direction, substantially perpendicularly to the length direction X of the fin 4. The gate 5 is separated from the fin 4 by a gate oxide layer (not shown).

The gate 5 can be created by a deposition process after which a suitable pattern is defined by lithography in which a suitable mask is defined by lithography.

In this example the gate 5 is shown as a thin line-shaped layer, but it may appear as plate-shaped, depending on its height (direction Z) in comparison to the height of the fin 4.

The gate material can be any suitable material: a doped semiconductor (such as poly-silicon) or a metal.

Figure 2:
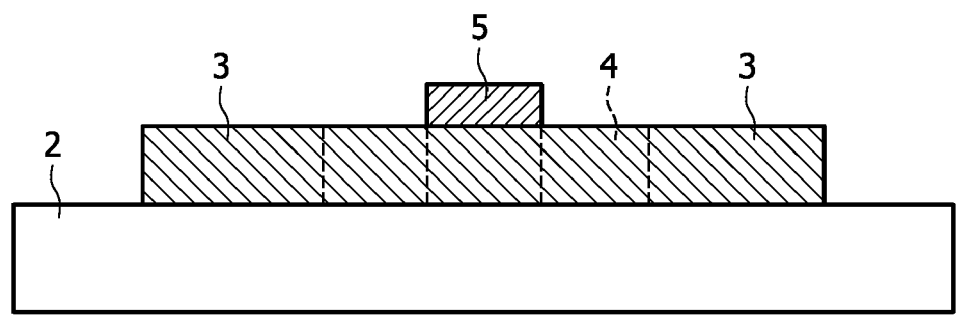
FIG. 2 shows a first cross-sectional view of the finFET structure of FIG. 1.

FIG. 2 shows a cross-sectional view of the finFET structure of FIG. 1. The cross-section is taken along the length direction X of the fin 4. Entities with the same reference number refer to identical entities as shown in the preceding Figure.

Figure 3:
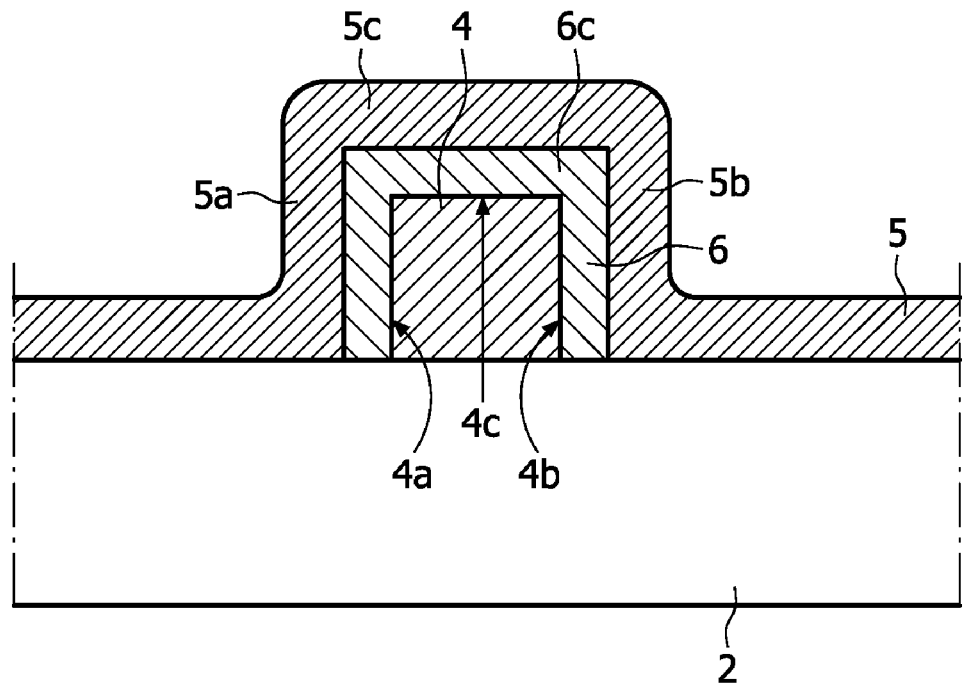
FIG. 3 shows a schematic cross-sectional view of a finFET structure according to the present invention.

FIG. 3 shows a schematic cross-sectional view of a finFET structure according to the present invention. The cross-section shows the fin 4 on top of the insulating layer 2. The gate 5 covers, by means of its vertical parts 5a, 5b, the sidewall portions 4a, 4b of the fin 4 and, by means of its horizontal top part 5c, the top portion 4c of the fin 4.

As described above with reference to FIG. 1, the gate 5 is separated from the fin 4 by a gate oxide layer 6. The gate oxide layer covers the sidewalls 4a, 4b of the fin 4 and top gate portion 6c covers the top 4c of the fin 4. The gate oxide layer 6 can be formed by a suitable oxide growth process or by a deposition process to form a high-K material layer acting as gate isolation layer 6.

Figure 4:
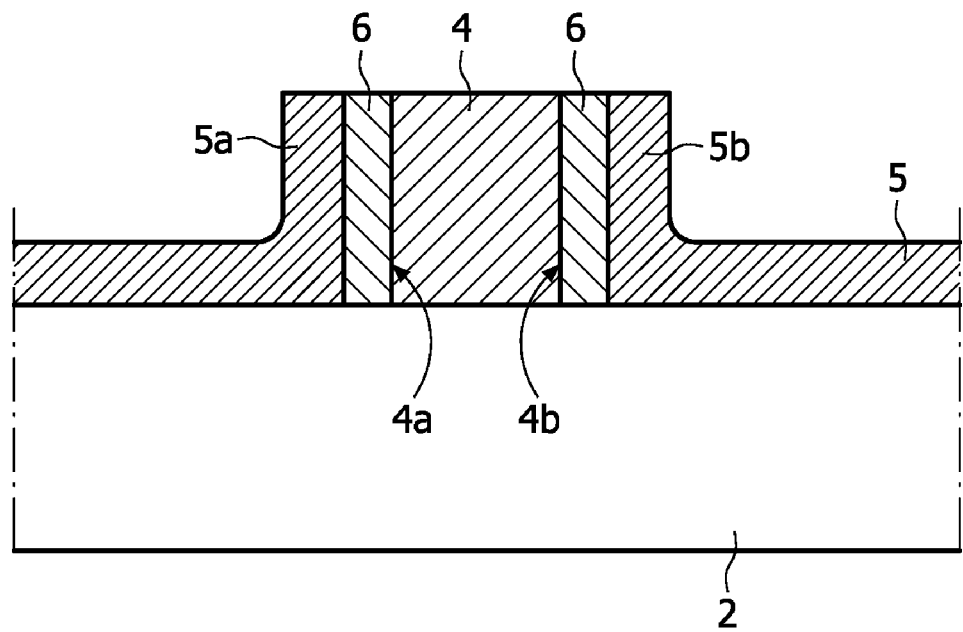
FIG. 4 shows a schematic cross-sectional view of a finFET structure according to the present invention.

FIG. 4 shows a schematic cross-sectional view of a finFET structure according to the present invention.

In a next step to form the finFET structure according to the present invention, the horizontal top part 5c of the gate 5 is removed by a chemical-mechanical polishing (CMP) process or an etch-back process.

The finFET structure now comprises a dual gate structure with a first vertical gate 5a and a second vertical gate 5b.

As will be explained below, during the removal of the top part 5c of the gate 5, the top gate part 6c of the gate oxide layer 6 is typically also removed, but may be preserved, if necessary.

Figure 5:
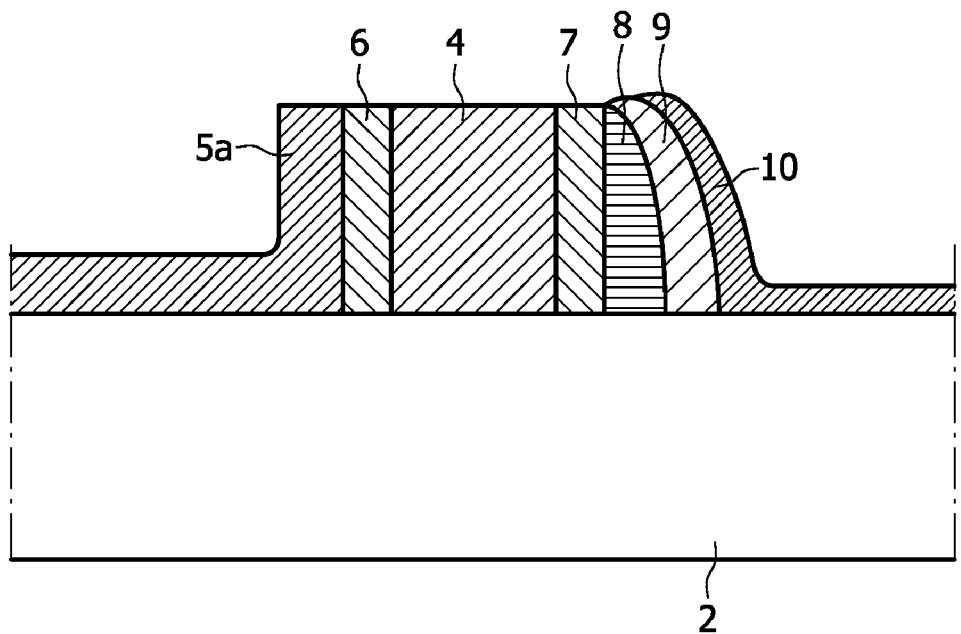
FIG. 5 shows a schematic cross-sectional view of a first embodiment of a finFET structure according to the present invention.

FIG. 5 shows a schematic cross-sectional view of a first embodiment of a finFET structure according to the present invention.

In a further step, one of the vertical gates 5a, 5b is removed, for example the second vertical gate 5b.

First, a suitable first mask is defined on top of the finFET structure to cover the top of the fin 4 and the vertical gate 5a that is to remain. If required, a thin oxide layer (not shown) may be provided on the top region of the fin 4 before applying the first mask.

Subsequently, the second vertical gate 5b not covered by the first mask and the gate oxide layer 6 on the sidewall 4b of the fin 4 adjacent to the second vertical gate 5b are removed by a dry or wet etching process. After this step a first dielectric layer 7 is formed on the exposed sidewall 4b of the fin 4 by a process for selective growth of silicon dioxide.

Then, a first layer of poly-silicon is deposited in a blanket mode. By etch-back (dry etching) of the poly-silicon layer, a spacer 8 of poly-silicon is formed which is adjacent to fin 4 (but separated from it by the first dielectric 7).

Then, a second dielectric layer 9 is deposited in blanket mode. Again, by etch-back (dry etching) of the second dielectric layer, a spacer 9 of second dielectric material is formed which is adjacent to the poly-silicon spacer 8.

Preferably, the first dielectric layer, the first layer of poly-Si and the second dielectric layer are deposited and patterned while the first mask to cover the top of the fin 4 and the vertical gate 5a, is still present.

Finally, a control gate layer 10 is deposited (in blanket mode). Again, the gate material can be any suitable material: a doped semiconductor or a metal.

A second mask is defined to remove the control gate 10 above the finFET structure. By etching, the control gate 10 is defined. The control gate 10 is now adjacent to the second dielectric spacer 9. If still present, the mask to cover the top of the fin 4 and the vertical gate 5a, can be simultaneously removed using the second mask.

Thus, a finFET structure with an access gate 5a, a channel 4, a floating gate stack 7, 8, 9 and a control gate 10 is formed. The floating gate stack 7, 8, 9 comprises a set of layers which are parallel to the plane of the sidewall 4b, the set of layers being the first dielectric 7, the poly-silicon charge storage layer 8 and the second dielectric 9.

The first dielectric 7 is positioned directly adjacent to the sidewall 4b of the fin 4. Next, the poly-silicon charge storage layer 8 is positioned adjacent to the first dielectric 7. Finally, the second dielectric 9 is positioned adjacent to the charge storage layer 8.

Typically, in the first embodiment the height of the finFET structure is about equal to, or somewhat less than, the thickness of the silicon top layer of the SOI wafer, i.e. between about 30 and about 150 nm. The access gate 5a typically has a thickness of about 50 nm (on the sidewall). The gate oxide layer 6 has a thickness of a few nm, say between 1 and 8 nm. The width of the fin (channel) 4 is between about 10 and about 50 nm. The thickness of the first dielectric 7 is between about 4 and about 10 nm. The thickness of the floating gate 8 is about 50 nm or higher. The thickness of the second dielectric 9 is between about 10 and about 20 nm. Finally, the thickness of the control gate (on the sidewall) is about 50 nm or higher.

Figure 6:
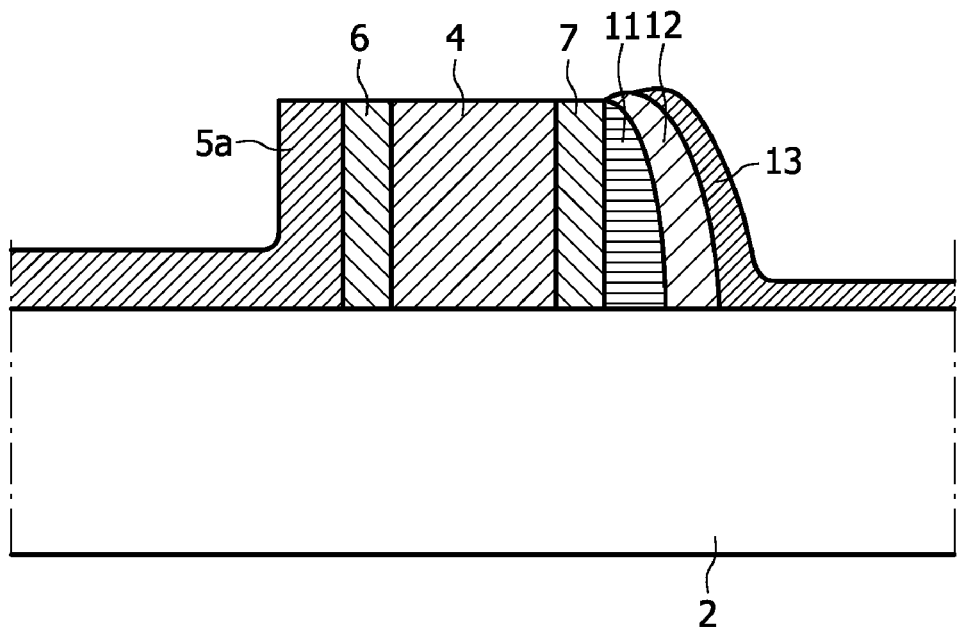
FIG. 6 shows a schematic cross-sectional view of a second embodiment of a finFET structure according to the present invention.

FIG. 6 shows a schematic cross-sectional view of a second embodiment of a finFET structure according to the present invention.

In the second embodiment the finFET comprises an ONO charge trapping stack of a first silicon dioxide layer, a silicon nitride layer and a second silicon dioxide layer.

The ONO charge trapping stack is formed in a similar way as the floating gate stack of the first embodiment. The floating gate 8 is replaced by a silicon nitride spacer 11 by depositing a silicon nitride layer in blanket mode and subsequently an etch-back to form the spacer shape.

Then, a third dielectric layer is deposited in blanket mode. Again, by dry etching of the third dielectric layer, a spacer 12 of dielectric material is formed which is adjacent to the polysilicon spacer 11. As described below, the thickness of the third dielectric 12 in the second embodiment will typically be less than that of the third dielectric in the first embodiment.

Preferably, the second dielectric, the silicon nitride layer and the second dielectric layer are deposited and patterned while the first mask to cover the top of the fin 4 and the vertical gate 5a, is still present.

Next, a control gate layer 13 is formed in a similar way as the control gate 10 of the first embodiment. Again, the gate material can be any suitable material: a doped semiconductor or a metal.

All other steps to form the finFET structure according to the second embodiment are similar to the steps discussed with reference to FIG. 5.

Thus, a finFET structure with an access gate 5a, a channel 4, an ONO charge trapping stack 7, 11, 12 and a control gate 13 is formed. The ONO charge trapping stack comprises a set of layers which are parallel to the plane of the sidewall 4b, the set of layers being the first dielectric layer 7, the silicon nitride layer 11 for charge storage and the second gate dielectric 12.

The first dielectric 7 is positioned directly adjacent to the sidewall 4b of the fin 4. Next, the silicon nitride layer 11 is positioned adjacent to the first dielectric 7. Finally, the second dielectric 12 is positioned adjacent to the silicon nitride layer 11.

Typically, in the second embodiment the height of the finFET structure is about equal to, or somewhat less than, the thickness of the silicon top layer of the SOI wafer, say between about 30 and about 150 nm. The access gate 5a typically has a thickness of at least 60 nm (on the sidewall). The gate oxide layer 6 has a thickness of a few nm, say between 1 and 8 nm. The width of the fin (channel) 4 is between about 10 and about 50 nm. The thickness of the second gate dielectric 7 is about 2 nm. The thickness of the silicon nitride 11 is about 4 to 7 nm. The thickness of the second dielectric 9 is between about 4 and about 10 nm. Finally, the thickness of the control gate is about 60 nm or more (on the sidewall).

It is noted that, as shown in FIG. 4, during the removal of the top part 5c of the gate 5, the top part of the gate oxide layer 6 is typically also removed, but, if necessary (for example, for reasons relating to processing), the top part of the gate oxide layer 6 may be preserved. In the case of a non-volatile memory device which comprises an ONO charge trapping stack, the top gate part 6c of the gate oxide layer 6 is preferably removed to avoid formation of the ONO stack on the top part 4c of the fin 4. In the case of a non-volatile memory device comprising a floating gate, i.e. the first embodiment, the top gate part 6c may remain on top of the fin 4.

The invention claimed is:

1. A non-volatile memory device on a substrate layer comprising semiconductor source and drain regions, a semiconductor channel region, a floating gate stack and a control gate;
   the semiconductor channel region being fin-shaped having two sidewall portions and a top portion, and extending between the source region and the drain region;
   the floating gate stack being positioned in contact with one sidewall portion of the fin-shaped semiconductor channel region and between the source and drain regions, and being substantially perpendicular to the length direction (X) of the fin-shaped semiconductor channel region;
   the control gate being in contact with the floating gate stack, wherein
   an access gate is provided adjacent to the other sidewall portion of the fin-shaped semiconductor channel region and separated therefrom by only an intermediate gate oxide layer, and
   wherein the floating gate stack comprises a set of layers which are parallel to the plane of the sidewall portion of the fin-shaped semiconductor channel region.

2. The non-volatile memory device according to claim 1, wherein the set of layers of the floating gate stack comprise a first dielectric layer, a floating gate layer and a second dielectric layer; the floating gate layer being arranged for storing charge.

3. The non-volatile memory device according to claim 1, wherein the set of layers of the floating gate stack comprise a first dielectric layer, a silicon nitride layer and a second dielectric layer; the silicon nitride layer being arranged for storing charge.

4. The non-volatile memory device according to claim 2, wherein the floating gate layer is a spacer.

5. The non-volatile memory device according to claim 4, wherein the second dielectric layer is a spacer.

6. The non-volatile memory device according to claim 1, wherein the access gate comprises a semiconductor material or a metal.

7. The non-volatile memory device according to claim 1, wherein the control gate comprises a semiconductor material or a metal.

8. The non-volatile memory device according to claim 3, wherein the silicon nitride layer is a spacer.

9. The non-volatile memory device according to claim 8, wherein the second dielectric layer is a spacer.

10. The non-volatile memory device according to claim 1, wherein the access gate and the control gate are separated from the respective sidewalls of the fin-shaped semiconductor channel region by an unequal number of layers.

11. A method of manufacturing a non-volatile memory device on a substrate layer, the method comprising:
    forming semiconductor source and drain regions;
    forming a semiconductor channel region, the semiconductor channel region being fin-shaped and having two sidewall portions and a top portion, and extending between the source region and the drain regions;
    forming a gate oxide layer covering the sidewalls and top portion of the fin-shaped semiconductor channel region;
    forming a floating gate stack, the floating gate stack being positioned between the source and drain regions and being substantially perpendicular to the length direction of the fin-shaped semiconductor channel region, and
    forming a control gate, the control gate being in contact with the floating gate stack, wherein the method further comprises
    forming an access gate adjacent to one sidewall portion of the fin-shaped semiconductor channel region and separated from the fin-shaped semiconductor channel region by the gate oxide layer, and
    wherein the floating gate stack is formed adjacent to and in contact with, the other sidewall portion of the fin-shaped semiconductor channel region; and
    wherein forming the access gate comprises;
    creating a line-shaped gate extending across the fin-shaped semiconductor channel region;

removing a top portion of the line-shaped gate from the top of the fin-shaped semiconductor channel region; and removing a sidewall portion of the line-shaped gate from the sidewall of the fin-shaped semiconductor channel region that is opposite the access gate.

12. The method of manufacturing a non-volatile memory device according to claim 11, wherein forming the floating gate stack comprises:

forming a first dielectric layer;

forming a floating gate layer, and forming a second dielectric layer; the floating gate layer being arranged for storing charge.

13. The method of manufacturing a non-volatile memory device according to claim 12, wherein the forming of the floating gate layer comprises the formation of a floating gate spacer.

14. The method of manufacturing a non-volatile memory device according to claim 11, wherein forming the floating gate stack comprises:

forming a first dielectric layer;

forming a silicon nitride layer, and forming a second dielectric layer; the silicon nitride layer being arranged for storing charge.

15. The method of manufacturing a non-volatile memory device according to claim 14, wherein the forming of the silicon nitride layer comprises the formation of a silicon nitride spacer.

16. The method of manufacturing a non-volatile memory device according to claim 15, wherein the forming of the second dielectric layer comprises the formation of a spacer of the second dielectric.

* * * * *